United States Patent [19]

Ohki

[11] Patent Number: 5,045,912

[45] Date of Patent: Sep. 3, 1991

[54] BI-CMOS INTEGRATED CIRCUIT DEVICE HAVING A HIGH SPEED LATERAL BIPOLAR TRANSISTOR

[75] Inventor: Masaru Ohki, Tokyo, Japan

[73] Assignee: NEC Corporation, Tokyo, Japan

[21] Appl. No.: 513,463

[22] Filed: Apr. 23, 1990

[30] Foreign Application Priority Data

Apr. 21, 1989 [JP] Japan ................... 1-102427

[51] Int. Cl.⁵ .................. H01L 27/02; H01L 29/72
[52] U.S. Cl. ........................... 357/43; 357/35; 357/34
[58] Field of Search .............. 357/34, 35, 43; 351/43

[56] References Cited

U.S. PATENT DOCUMENTS

| | | | |
|---|---|---|---|
| 4,510,676 | 4/1985 | Anantha et al. | 29/577 |
| 4,609,929 | 9/1986 | Jayaraman et al. | 357/23.4 |
| 4,829,356 | 5/1989 | Arndt | 357/35 |

FOREIGN PATENT DOCUMENTS

| | | | |
|---|---|---|---|
| 63-219163 | 9/1988 | Japan | 357/43 |
| 63-219164 | 9/1988 | Japan | 357/43 |
| 63-219165 | 9/1988 | Japan | 357/43 |
| 1-041267 | 2/1989 | Japan | 357/43 |

OTHER PUBLICATIONS

Websters II Dictionary, p. 1144, 1984.

Primary Examiner—Andrew J. James
Assistant Examiner—Stephen D. Meier
Attorney, Agent, or Firm—Sughrue, Mion, Zinn, Macpeak & Seas

[57] ABSTRACT

Disclosed herein is a Bi-CMOS integrated circuit device including NPN and PNP bipolar transistors and N-channel and P-channel MOS transistor. The PNP transistor is formed in an epitaxial layer formed on a semiconductor substrate and has a collector region selectively formed in the epitaxial layer, a base region formed to straddle respective portions of the collector region and the epitaxial region and an emitter region selectively formed in the base region.

8 Claims, 3 Drawing Sheets

BI-CMOS INTEGRATED CIRCUIT DEVICE HAVING A HIGH SPEED LATERAL BIPOLAR TRANSISTOR

BACKGROUND OF THE INVENTION

1. Field of the Invention

The present invention relates to a Bi-CMOS integrated circuit which monolithically integrates a vertical NPN bipolar transistor, a lateral PNP bipolar transistor, an N-channel MOS field effect transistor (referred to as N-MOSFET hereinafter) and a P-channel MOS field effect transistor (referred to as P-MOSFET hereinafter).

2. Description of the Prior Art

In a Bi-CMOS integrated circuit, bipolar transistors of a vertical doubly diffused NPN transistor and a lateral PNP transistor are formed on the same P type silicon substrate together with an N-MOSFET and a P-MOSFET.

A Bi-CMOS integrated circuit is equipped with both advantages of bipolar transistor's features presenting a high speed operability and large current drivability and the C-MOSFET's feature of the low power consumption.

In bipolar transistors, the structure and the fabrication process are designed with special emphasis on the vertical NPN transistor, because the NPN transistor is a key element for the high speed operation. Accordingly, the PNP transistor is given a lateral transistors structure which is poor in operational characteristics.

The lateral PNP transistor is constructed with an N type epitaxial layer as a base region, P+ type emitter and collector regions diffused on the surface of the N type epitaxial layer in such a manner that the P+ type collector region surrounds the P+ type emitter region.

The base width which governs the operating speed of a lateral PNP transistor, is determined by the distance between the emitter and collector regions. The emitter junction area which governs the current capacity of the lateral transistor is determined by the product of the peripheral length of the emitter and the emitter diffusion depth.

However, the prior art Bi-CMOS integrated circuit has been unable to achieve a high speed operation and a large current drive to the extent expected.

BRIEF SUMMARY OF THE INVENTION

1. Object of the Invention

It is an object of the present invention to provide a Bi-CMOS integrated circuit which is adapted for high speed operation.

It is another object of the present invention to provide a Bi-CMOS integrated circuit which is adapted for large current drive.

2. Summary of the Invention

In the Bi-CMOS integrated circuit of the present invention, the lateral PNP transistor is formed on the surface of an N type epitaxial layer formed on a P type silicon substrate. The circuit uses a P well formed on the surface of the N type epitaxial layer as a collector, uses an N type diffused layer straddling the P well and the N type epitaxial layer as a base and uses a P+ type diffused layer formed in the N type diffused layer as an emitter.

The N type diffused layer that constitutes the base and the P+ type diffused layer that constitutes the emitter have a self-alignment structure which uses polysilicon as a mask. It is preferable to form a P+ type diffused layer as a collector contact at the same time that the P+ type diffused layer is formed.

In such PNP transistor the N type diffused layer between the P well and the P+ type diffused layer operates as a main base region. Therefore, it is easy to control and keep constant the base width which is determined by the difference between the diffusion depth of the N type diffused layer and the diffusion depth of the P+ diffused layer over most part of the composition surface of the emitter and the base.

Thus constructed lateral PNP transistor is suitable for high speed operation since it permits to reduce the base width which governs the carrier transit time. Moreover, it is suitable for large current drive since it enables an increase in the effective emitter junction area.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENT

Figure 1A:
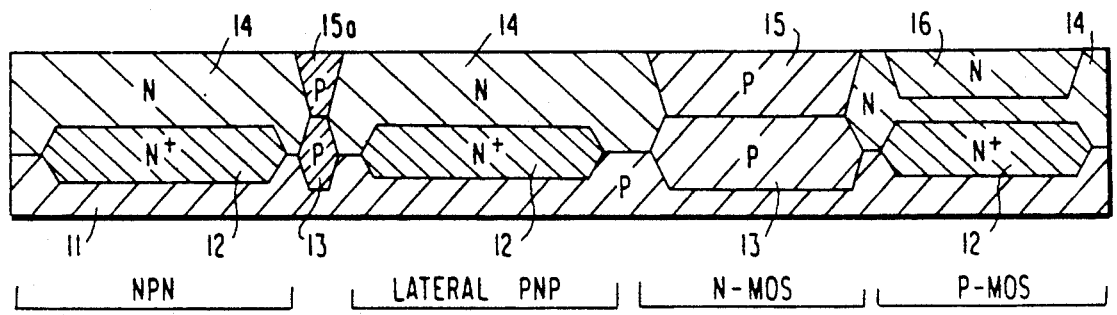
FIGS. 1(a) to 1(c) are sectional views of the Bi-CMOS integrated circuit according to the prior art as arranged in the order of the fabrication steps.
Figure 1B:
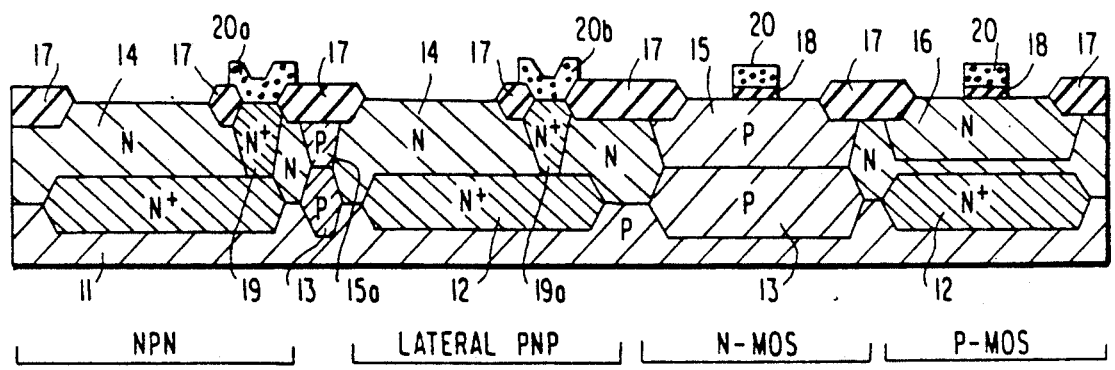
Figure 1C:
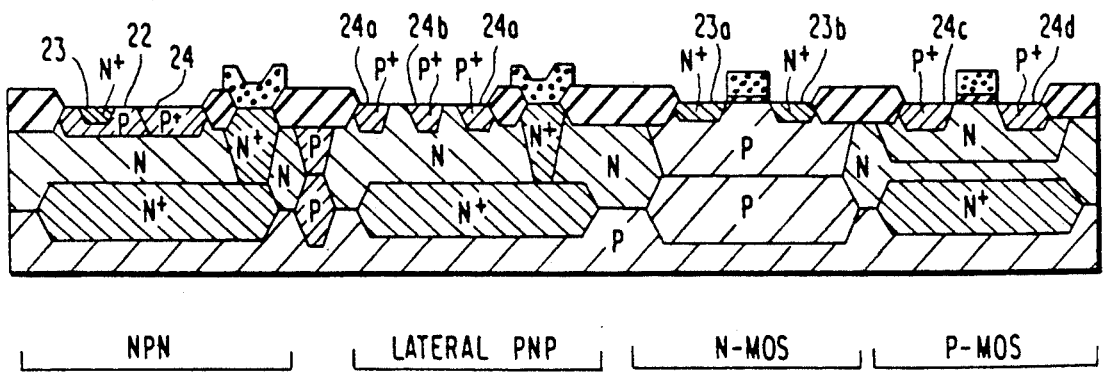

Referring to FIGS. 1(a) to 1(c), the prior art Bi-CMOS integrated circuit will be explained prior to the description of the present invention.

As shown in FIG. 1(a), first, an N+ type buried layer 12 is formed in a P type silicon substrate 11, then a P+ type buried layer 13 is formed.

Next, after growing an N type epitaxial layer 14 on the entire surface, a P well 15, a P type layer 15a for element isolation and an N well 16 are formed.

Next, as shown in FIG. 1(b), a field oxide film 17 is formed by the selective oxidation method.

Then, after forming a gate oxide film 18, the gate oxide film 18 over the planned regions for an N+ type collector 19 and an N+ type base 19a are selectively etched and then polysilicon is deposited on the surface.

Following the above, an N+ type collector 19 for an NPN transistor and an N+ type base 19a for a lateral PNP transistor are formed by diffusing phosphorus.

Next, by selectively etching polysilicon, a gate electrode 20, a collector electrode 20a for the NPN transistor and a base electrode 20b for the lateral PNP transistor consisting of polysilicon are formed.

Subsequently, as shown in FIG. 1(c), after forming a P type base 22 for the NPN transistor, an N+ type emitter 23 for the NPN transistor, an N+ type source 23a and a drain 23b for an N-MOSFET are formed simultaneously.

Next, a P+ type base 24 for the NPN transistor, a P+ type collector 24a for the lateral PNP transistor, a P+ type emitter 24b for the lateral PNP transistor and a source 24c and a drain 24d of P+ type for the P-MOSFET are formed, thereby completing a Bi-CMOS integrated circuit.

The PNP transistor of the Bi-CMOS integrated circuit obtained above is a lateral transistor.

The base width that governs the operating speed of the lateral PNP transistor is determined by the distance between the emitter diffused layer and the collector diffused layer formed by lithography. Since, however, it is not easy to reduce the distance, high speed operation of the transistor is hard to achieve.

Moreover, the emitter area which governs the current capacity of the lateral PNP transistor is determined by the product of the peripheral length of the emitter that faces the base diffused layer and the diffusion depth of the emitter, so that it is difficult to realize large current drive.

With the above in mind, an embodiment of the present invention will be described by making reference to FIGS. 2(a) to 2(f).

Figure 2A:
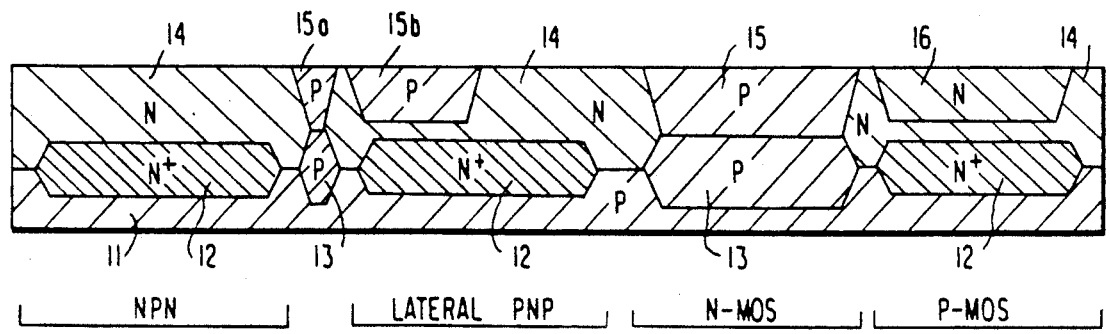
FIGS. 2(a) to 2(f) are sectional views of the Bi-CMOS integrated circuit according to the present invention as arranged in the order of the fabrication steps.

First, as shown in FIG. 2(a), an N+ type buried layer 12, then a P type buried layer 13 are formed in a P type silicon substrate 11. Since boron is doped as an impurity in the P type buried layer 13 and arsenic or antimony is doped as an impurity in the N+ type buried layer 12, the diffusion of the layer 13 extends vertically beyond that of the N+ type buried layer 12.

Next, after growing an N type epitaxial layer 14 of thickness 2 to 5 μm all over the surface, a P well 15, a P type layer 15a for element separation and a P type collector 15b for a lateral PNP transistor are formed simultaneously in the N type epitaxial layer 14 by selective diffusion, and subsequently an N well 16 is formed by selective diffusion. Since the P type buried layer 13 is diffused farther than the N+ type buried layer, the P well 15 and the P type layer 15a for element isolation are united with the P type buried layer 13, but the P type collector 15b is separated from the N+ type buried layer 12.

Figure 2B:
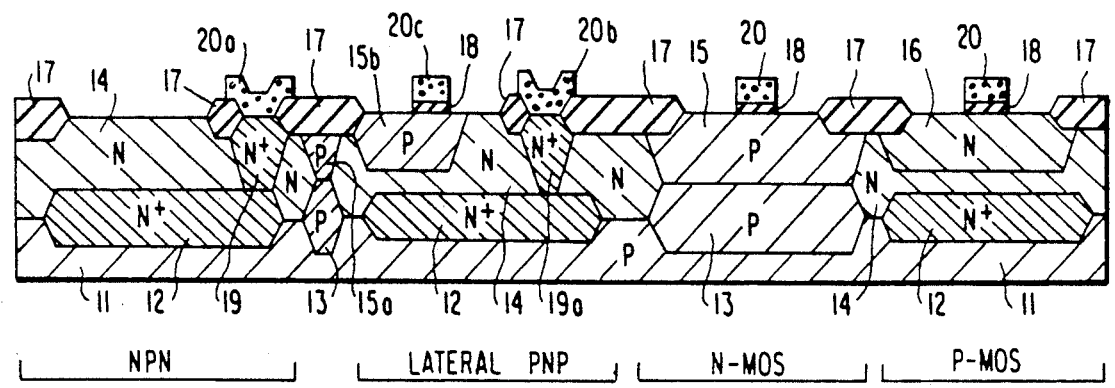

Then, as shown in FIG. 2(b), a field oxide film 17 with thickness of 0.6 to 1.0 μm is formed by the selective oxidation method. Next, a gate oxide film 18 with thickness 300 Å is formed at portions where no field oxide film is provided, and, after selectively etching the gate oxide film 18 over the planned regions for an N+ type collector lead-out region 19 and an N+ type base lead-out region 19a, polysilicon 20 is deposited to a thickness of 4000 to 6000 Å.

Next, an N+ type collector lead-out region 19 for an NPN transistor and an N+ type base lead-out region 19a for the lateral PNP transistor are formed by diffusing phosphorus at 900° C. to 920° C. through polysilicon into portions that are in direct contact with polysilicon.

Then, by selectively etching polysilicon, a gate electrode 20, a collector electrode 20a for the NPN transistor, a base electrode 20b for the lateral PNP transistor and a diffusion mask 20c for the base and emitter of the lateral PNP transistor, each consisting of polysilicon, are formed simultaneously. Next, the surfaces of the regions 14, 15, 15b and 16 are exposed as shown in FIG. 2(b) by selectively etching the gate oxide film with polysilicon left at 20, 20a, 20b and 20c as the masks.

Figure 2C:
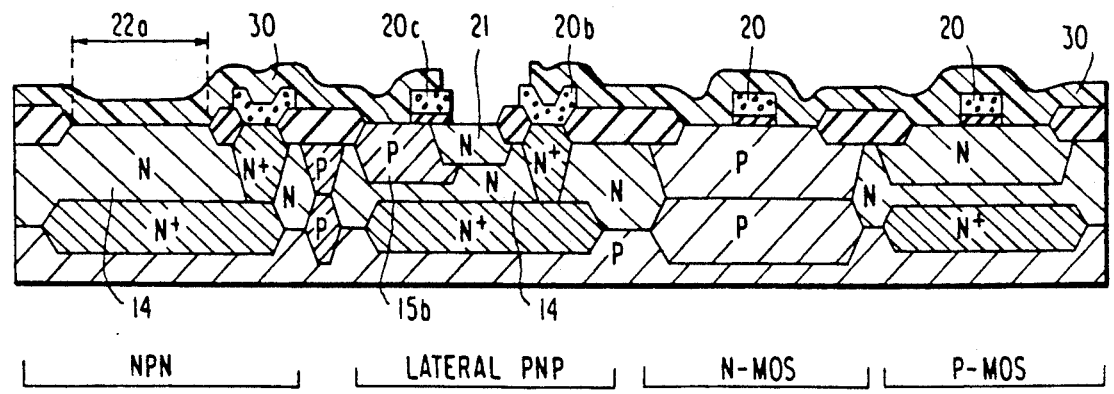

Subsequently, as shown in FIG. 2(c), an N type base 21 for the lateral PNP transistor is formed from the epitaxial layer 14 to overlap a portion of the P type collector 15b, by covering with a mask 30 the exposed portions except for the portion of the epitaxial layer 14 of the lateral PNP transistor and ion implanting phosphorus under the conditions of the acceleration energy in the range of 100 to 150 keV and the dose in the range of $5 \times 10^{12}$ to $5 \times 10^{14}$ cm$^{-2}$.

Figure 2D:
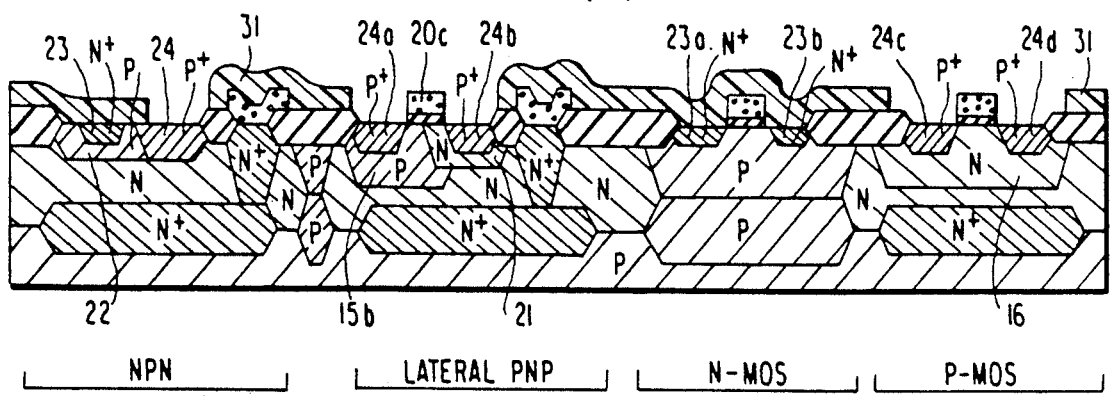

Next, by removing the mask material 30, a portion 22a shown in FIG. 2(c) of the epitaxial layer 14 is exposed over the region planned for the NPN transistor and by covering the remaining portion with another mask (not shown), a P type base 22 (see FIG. 2(d)) for the NPN transistor is formed in the portion 22a by ion implanting boron under the conditions of the acceleration energy in the range of 10 to 30 keV and the dose in the range of $1 \times 10^{13}$ to $5 \times 10^{13}$ cm$^{-2}$, and then the mask which is not shown is removed.

Next, a mask (not shown) is provided to expose a part of the P type base 22 and the surface of the region planned for the N-MOSFET, and an N+ type emitter 23 for the NPN transistor, an N+ source 23a and a drain 23b for the N-MOSFET are formed as shown in FIG. 2(d) by ion implanting arsenic into the exposed portions under the conditions of the acceleration energy of 70 keV and the dose in the range of $3 \times 10^{15}$ to $5 \times 10^{15}$ cm$^{-2}$. The mask which is not shown is removed following the ion implantation.

Then, as shown in FIG. 2(d), a mask material 31 is provided so as to expose a part of the P type base 22, a planned region for the lateral PNP transistor and a planned region for the P-MOSFET. Using the mask 31, a P+ type base contact region 24 within the P type base 22 for the NPN transistor, a P+ type collector contact region 24a within the P type collector 15b in the region planned for the PNP transistor, a P+ type emitter 24b within the N type base 21, and a P+ type source 24c and a P+ type drain 24d within the N well 16 in the region planned for the P-MOSFET are formed simultaneously by implanting boron ions under the conditions of the acceleration energy in the range of 10 to 30 keV and the dose in the range of $1 \times 10^{15}$ to $5 \times 10^{15}$ cm$^{-2}$.

Figure 2E:
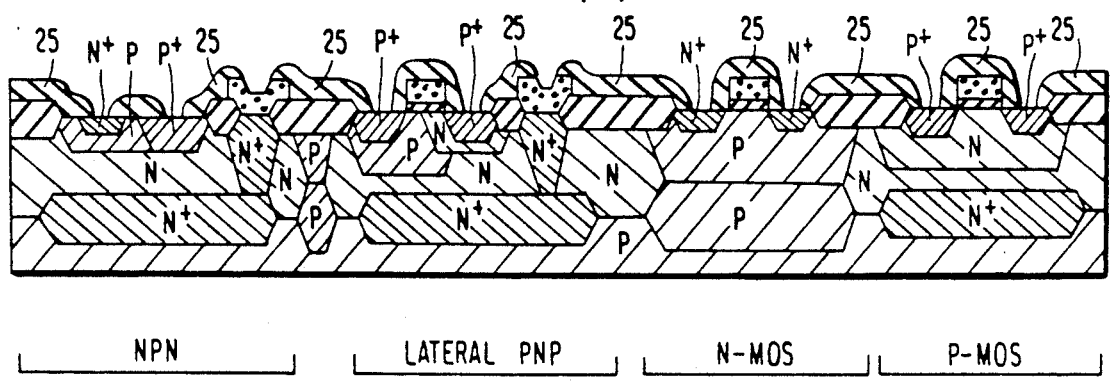

Next, as shown in FIG. 2(e), a boro-phospho-silicate glass film 25 with thickness of 0.6 to 1.0 μm is deposited over the entire surface and flattened by giving a heat treatment, and openings are provided at the parts to be connected with the aluminum electrodes. A heat treatment is again given to smooth the respective edges of the openings.

Figure 2F:
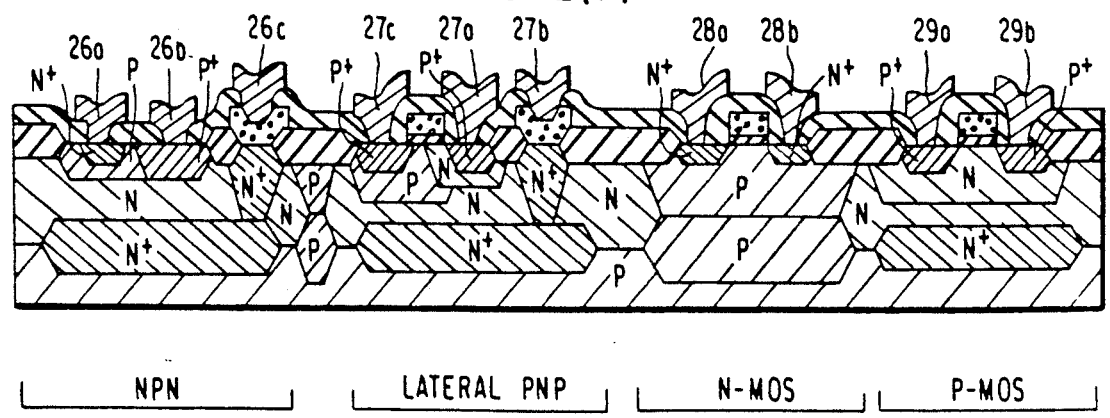

Subsequently, an aluminum layer is formed on the surface, unwanted parts are removed by etching, and an emitter electrode 26a, a base electrode 26b and a collector electrode 26c for the NPN transistor, an emitter 27a, a base emitter 27b and a collector electrode 27c for the lateral PNP transistor, a source electrode 28a and a drain electrode 28b for the N-MOSFET and a source electrode 29a and a drain electrode 29b for the P-MOSFET, consisting of aluminum, are formed as shown in FIG. 2(f), thereby completing the element part of the Bi-CMOS integrated circuit.

As explained in the above, the lateral PNP transistor of the present invention is composed of the P type collector 15b diffused simultaneously with the P well 15, and the N type base 21 and the P+ type emitter 24b formed in self-aligned manner by ion implantations that use the polysilicon 20c and the field oxide film 17 as the diffusion mask. Since the base width is determined by the difference between the diffusion depth of the N type base 21 and the diffusion depth of the P+ type emitter 24b, it becomes possible to reduce the base width with excellent reproducibility. In this manner, a high speed operation of the lateral PNP transistor became realizable through reduction of the carrier transit time by diminishing the base width.

Moreover, since the base width that is determined by the difference between the diffusion depth of the N type diffused layer and the diffusion depth of the P+type diffused layer can be kept constant over a wide range of the composition plane of the emitter and the base that faces the P type collector, the effective emitter area of the P+ type emitter facing the N type base can be enlarged and it becomes possible to achieve large current drive. It is to be mentioned that the collector contact region 24a is formed in self-aligned fashion simultaneous with the emitter 24b using the polysilicon 20c as the mask.

By the use of the lateral PNP transistor as described above there can be realized a Bi-CMOS integrated circuit which is equipped with both advantages of high speed operation and large current drive of the bipolar transistor and the low power consumption of the C-MOSFET.

Although the invention has been described with reference to a specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any modifications or embodiments that fall within the true scope of the invention.

I claim:

1. An integrated circuit having a PNP transistor formed on a semiconductor substrate, an NPN transistor formed on said semiconductor substrate, an N-channel field effect transistor formed on said semiconductor substrate and a P-channel field effect transistor formed on said semiconductor substrate, said PNP transistor comprising:

a N-type base region including first and second portions, said first portion being formed on said semiconductor substrate and said second portion being selectively formed in said first portion with an impurity concentration higher than the impurity concentration of said first portion;

a P-type collector region selectively formed in said first portion of said base region with an impurity concentration higher than the impurity concentration of said first portion and smaller than the impurity concentration of said second portion, said collector region having a side surface portion that is in contact with a side surface portion of said second portion of said base region to form a PN junction therebetween; and a P-type emitter region selectively formed in said second portion of said base region with an impurity concentration higher than the impurity concentration of said second portion, said emitter region having a side surface portion forming a PN junction with said second portion along with said side surface portion of said second portion; wherein a part of said second portion of said base region sandwiched between said side surface portion of said emitter region and said side surface portion of said collector region forms an active base region through which a current substantially flows between emitter and collection regions.

2. An integrated circuit having a PNP transistor formed on a P-type silicon substrate, an NPN transistor formed on said silicon substrate, an N-channel field effect transistor formed on said silicon substrate and a P-channel field effect transistor formed on said silicon substrate, said PNP transistor comprising:

a semiconductor layer of N-type formed on said silicon substrate; a semiconductor region of N-type selectively formed in said semiconductor layer with a first impurity concentration higher than the impurity concentration of said semiconductor layer;

a collector region of P-type selectively formed in said semiconductor layer to form a first PN junction therebetween, said collector region having a second impurity concentration smaller than said first impurity concentration and a depth larger than the depth of said semiconductor region, said collector region being in contact with said semiconductor region to form a second PN junction therebetween, said first PN junction making contact with said second PN junction at a bottom surface of said semiconductor region; and an emitter region of P-type selectively formed in said semiconductor region with a third impurity concentration higher than said first impurity concentration to form a third PN junction therebetween, said third PN junction having a portion that is substantially parallel to said second PN junction; wherein a portion of said semiconductor region sandwiched between said second PN junction and said portion of said third PN junction forms an active base region through which a current substantially flows between said emitter and collection regions.

3. An integrated circuit as claimed in claim 2, wherein said NPN transistor comprises:

an N+ type buried layer formed on said silicon substrate;

a second N type semiconductor layer formed on said N+ type buried layer;

an N+ type collector layer which reaches from the surface of said second N type semiconductor layer to said N+ type buried layer;

a P type base layer formed on the surface of said second N type semiconductor layer; and an N+ emitter layer formed in said P type base layer.

4. An integrated circuit as claimed in claim 2, wherein said N channel field effect transistor comprises:

a second N type semiconductor layer formed on said P type silicon substrate;

a P type well layer formed on the surface of said second N type semiconductor layer;

a gate oxide film formed on the surface of said P type well layer;

a gate electrode formed on said gate oxide film; and an N+ type source layer and a drain layer formed on said P type well layer with said gate electrode in between.

5. An integrated circuit as claimed in claim 2, wherein said P channel field effect transistor comprises:

a second N type semiconductor layer formed on said P type silicon substrate;

an N type well layer formed on the surface of said second N type semiconductor layer;

a gate oxide film formed on the surface of said N type well layer;

a gate electrode formed on said gate oxide film; and a P+ type source layer and a drain layer formed on the surface of said N type well layer with said gate electrode in between.

6. An integrated circuit device having a lateral transistor formed on a semiconductor substrate, said lateral transistor comprising:

a base region of one conductivity type, said base region including an island region formed on said semiconductor substrate and a semiconductor region selectively formed in said island region with a first impurity concentration higher than the impurity concentration of said island region, a collector region of an opposite conductivity type selectively formed in said island region of said base region to form a first PN junction therebetween, said collector region being in contact with a side surface portion of said semiconductor region of said base region to form a second PN junction therebetween and having a second impurity concentration and having a second impurity concentration smaller than said first impurity concentration, and an emitter region of said opposite conductivity type selectively formed in said semiconductor region of said base region with a third impurity concentration higher than said first impurity concentration with a third PN junction therebetween, said third PN junction having a portion that is substantially in parallel to said second PN junction, wherein a portion of said semiconductor region of said base region sandwiched between said second PN junction and said portion of said third PN junction forms an active base region through which a current substantially flows between said emitter and collector regions.

7. The device as claimed in claim 6, wherein said portion of said semiconductor region of said base region is covered with an insulating film and a polysilicon layer formed on said insulating film.

8. The device as claimed in claim 6, wherein said collector region is formed with a depth larger than the depth of said semiconductor region to be in contact with a part of a bottom surface portion of said semiconductor region so the said second PN junction makes contact with said first PN junction at the bottom surface of said semiconductor region.

* * * * *